United States Patent [19]

Torigoe et al.

[11] Patent Number: 4,653,903
[45] Date of Patent: Mar. 31, 1987

[54] EXPOSURE APPARATUS

[75] Inventors: Makoto Torigoe, Kawasaki; Michio Kohno; Akiyoshi Suzuki, both of Tokyo, all of Japan

[73] Assignee: Canon Kabushiki Kaisha, Tokyo, Japan

[21] Appl. No.: 690,940

[22] Filed: Jan. 14, 1985

[30] Foreign Application Priority Data

Jan. 24, 1984 [JP] Japan ................................. 59-10544
Jan. 11, 1985 [JP] Japan ................................. 60-2203
Jan. 11, 1985 [JP] Japan ................................. 60-2204

[51] Int. Cl.$^4$ ............................................. G03B 27/42
[52] U.S. Cl. ........................................ 355/53; 355/77
[58] Field of Search ................. 355/53, 46, 40, 43, 355/45, 89, 20, 86, 95, 77, 71; 350/523

[56] References Cited

U.S. PATENT DOCUMENTS 3,614,225 10/1971 Dinella ............................. 355/133 X
4,132,479 1/1979 Dubroeucq et al. .................. 355/71
4,498,742 2/1985 Uehara ................................. 350/523

Primary Examiner—Michael L. Gellner
Assistant Examiner—D. Rutledge
Attorney, Agent, or Firm—Fitzpatrick, Cella, Harper & Scinto

[57] ABSTRACT

An exposure apparatus having a single light source and a plurality of exposure stages for carrying thereon wafers, respectively. The light emitting from the light source is directed to a plurality of masks simultaneously or sequentially, so that the patterns of the masks are simultaneously or sequentially transferred onto the wafers, respectively, carried on the exposure stages. In a preferred form, the light source comprises an excimer laser providing a pulsed laser beam.

11 Claims, 3 Drawing Figures

EXPOSURE APPARATUS

BACKGROUND OF THE INVENTION

This invention relates to an exposure apparatus for use in the manufacture of semiconductor circuit devices and, more particularly, to an exposure apparatus for transferring a pattern of a mask onto a wafer.

Various types of exposure apparatuses have been developed for the manufacture of semiconductor circuit devices such as integrated circuits (ICs), large scaled integrated circuits (LSIs), etc. Each of such exposure apparatuses includes its own light source for providing an exposure beam by which a circuit pattern formed on a mask or reticle is irradiated so that the circuit pattern is transferred onto a wafer having a photoresist coating.

Also as is well known, the exposure apparatus mass-produces wafers having printed circuit patterns through the repetition of various working steps such as transportation of the wafer to the exposure stage, alignment between the mask and wafer, exposure of the wafer to the mask pattern, discharging the wafer from the exposure stage, etc.

Thus, the exposure step is merely a part of the working steps necessary for printing the circuit pattern onto wafer. Nevertheless, each the current exposure apparatus has its own light source for providing the exposure beam and this light source is continuously energized for the sake of stabilization of the exposure beam. During the working steps other than the exposure step, e.g. during the alignment step, a light blocking member such as a shutter is used to prevent exposure of the wafer resting on the exposure stage.

For this reason, each exposure apparatus becomes necessarily bulky, requiring a large space. This is inconvenient, since usually a plurality of such exposure apparatuses are juxtaposed in a semiconductor device manufacuring factory. In addition, consumption of energy is excessive because the exposure light source is always energized even during the steps other than the exposure step.

SUMMARY OF THE INVENTION

It is accordingly a primary object of the present invention to provide an exposure apparatus which eliminates the above-described disadvantages peculiar to the prior art.

It is another object of the present invention to provide an exposure apparatus capable of performing pattern transfer operations simultaneously or sequentially relative to a plurality of wafers, while saving the space and energy.

Briefly, according to the present invention, there is provided an exposure apparatus having a single light source and a plurality of exposure stages for carrying thereon wafers, respectively. The light emitting from the light source is directed to a plurality of masks simultaneously or sequentially, so that the patterns of the masks are simultaneously or sequentially transferred onto the wafers, respectively, carried on the exposure stages. In a preferred form, the light source comprises an excimer laser providing a pulsed laser beam.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
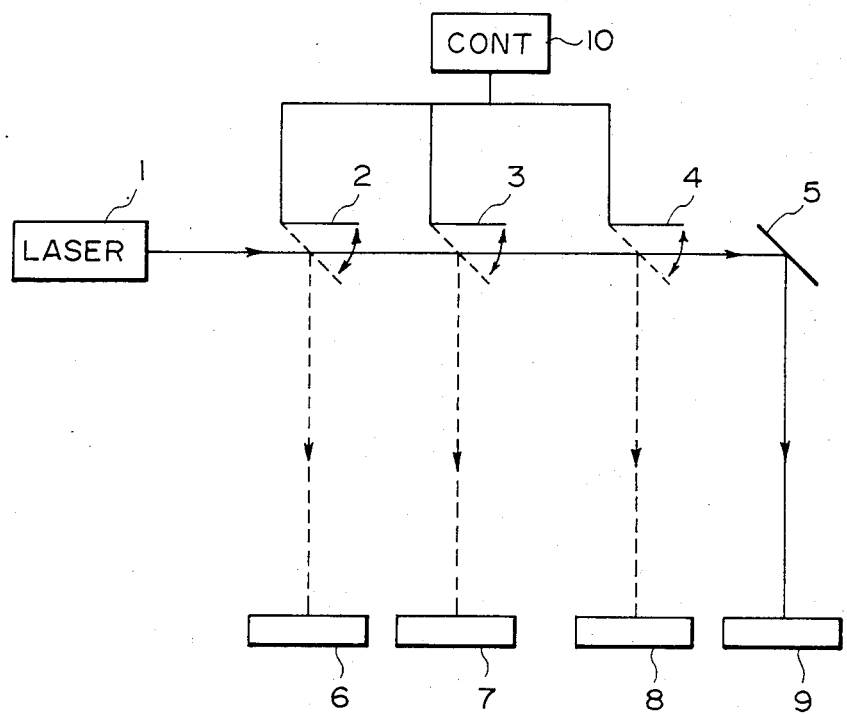
FIG. 1 is a schematic and diagrammatic view showing the principle of the present invention.

FIG. 1 schematically shows an exposure apparatus according to a first embodiment of the present invention. The exposure apparatus includes a light source 1 for providing an exposure beam. In the present embodiment, the light source 1 comprises a laser such as, for example, an excimer laser providing a beam of high luminance. The exposure apparatus further includes optical path dividing members 2-4 such as swingable mirrors which are movable in the directions as denoted by double-headed arrows in FIG. 1. Denoted by a reference numeral 5 is a stationary mirror. There are also provided a plurality of exposure stages 6-9 for carrying thereon wafers, respectively. Although not shown in FIG. 1, a plurality of masks or reticles are disposed in close proximity to or in contact with the wafers carried on the exposure stages, respectively, so that the circuit pattern of each of the masks (or reticles) is transferred onto a corresponding one of wafers. The masks (or reticles) may be disposed just after the mirrors 2-5. In such case, an image forming optical system may be disposed between each of the mirrors 2-5 and each of the exposure stages 6-9 to project the mask pattern onto an associated one of the wafers. As a further alternative, a single mask or reticle may be disposed between the laser 1 and the mirror 2, in place of using plural masks or reticles.

A control unit 10 is provided to control the swinging movement of each of the mirrors 2-4. When the wafer carried by the stage 6 is to be exposed, the mirror 2 is moved by the control unit 10 to the broken line position shown in FIG. 1. When the wafer carried on the stage 7 is to be exposed, the mirror 2 is moved to its solid line position while the mirror 3 is moved to its broken line position. When the wafer carried on the stage 8 is to be exposed, the mirrors 2 and 3 are moved to their solid-line positions while the mirror 4 is moved to its broken line position. When the wafer carried on the stage 9 is to be exposed, all the mirrors 2-4 are moved to their solid-line positions. While in the present embodiment the mirrors 2-4 act also as shutter means, separate shutter mechanisms may be disposed between the mirrors 2-5 and the stages 6-9, respectively, which shutter mechanisms are arranged to operate in coordinated relation with the operations of the mirrors 2-4. By these swinging actions of the mirrors 2-4, the laser beam emitted from the source 1 is sequentially directed to the stages 6-9.

During a time period during which the wafer carried by one of the stages 6-9 is exposed, various steps before and/or after the exposure step are effected at the other exposure stages, such as wafer feeding, wafer discharge, prealignment of the wafer, fine alignment between the mask and wafer, etc. With this arrangement of the exposure apparatus of the present invention, wafer exposures can be achieved efficiently with a single light source.

While in the present embodiment the light beam emitted from the laser source 1 is divided, with time, by the mirrors 2-4 and is directed sequentially to the stages 6-9, the mirrors 2-4 may be replaced by stationary half mirrors each of which is effective to reflect, toward a corresponding one of the stages 6-9, a light beam of the quantity approximately equal to a quarter of the quantity of light provided by the light source 1. In such case, the exposure apparatus may be controlled by an unshown control unit in such manner that the same operations are effected at the stages 6-9 at the same time. Namely, the wafer feeding step, alignment step for aligning the mask and wafer, exposure step, wafer discharging step, etc., at one exposure stage are synchronized with the corresponding steps at the other exposure stages.

Figure 2:
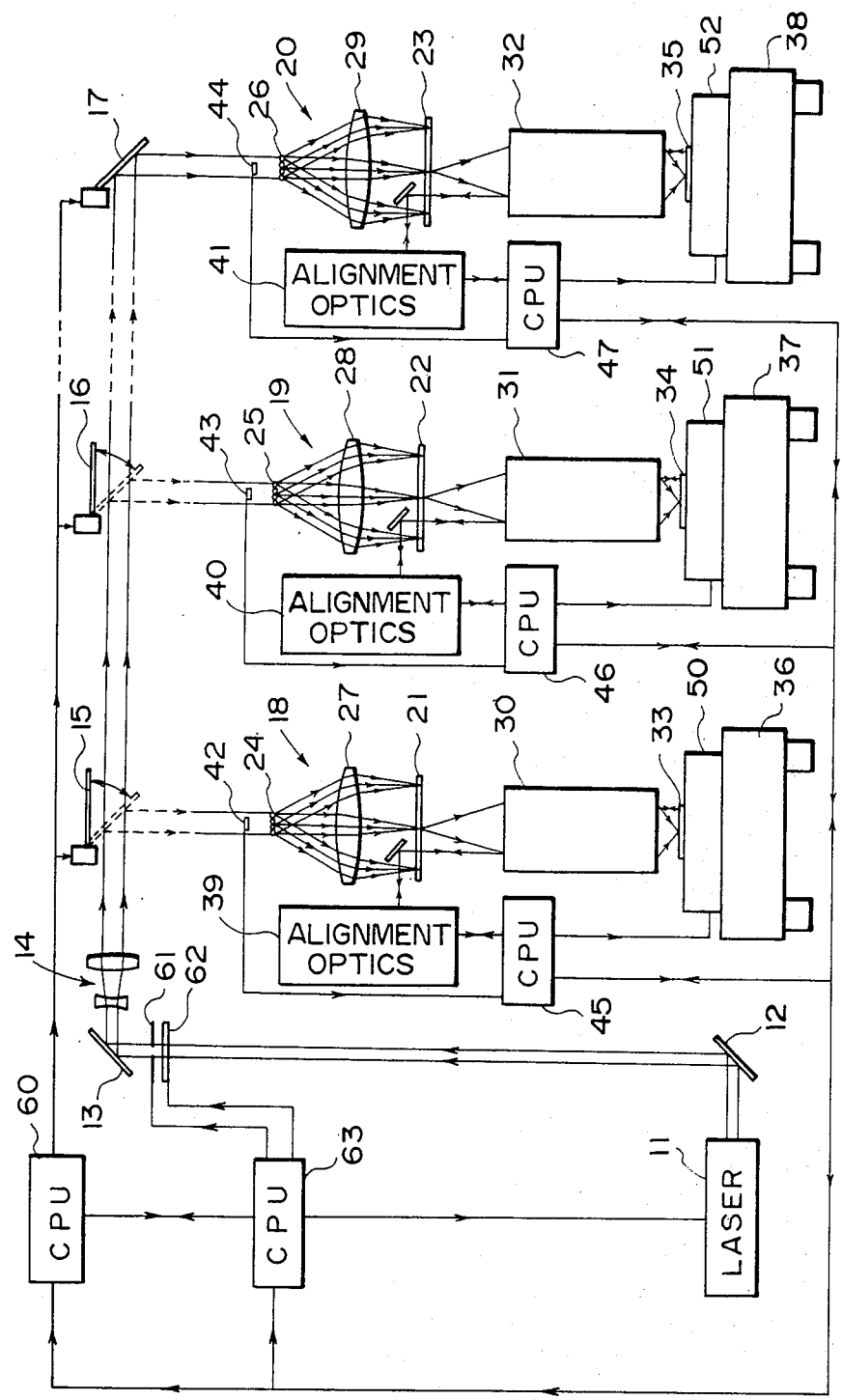
FIG. 2 is a schematic and diagrammatic view showing a step-and-repeat type exposure apparatus according to an embodiment of the present invention.
Figure 3:
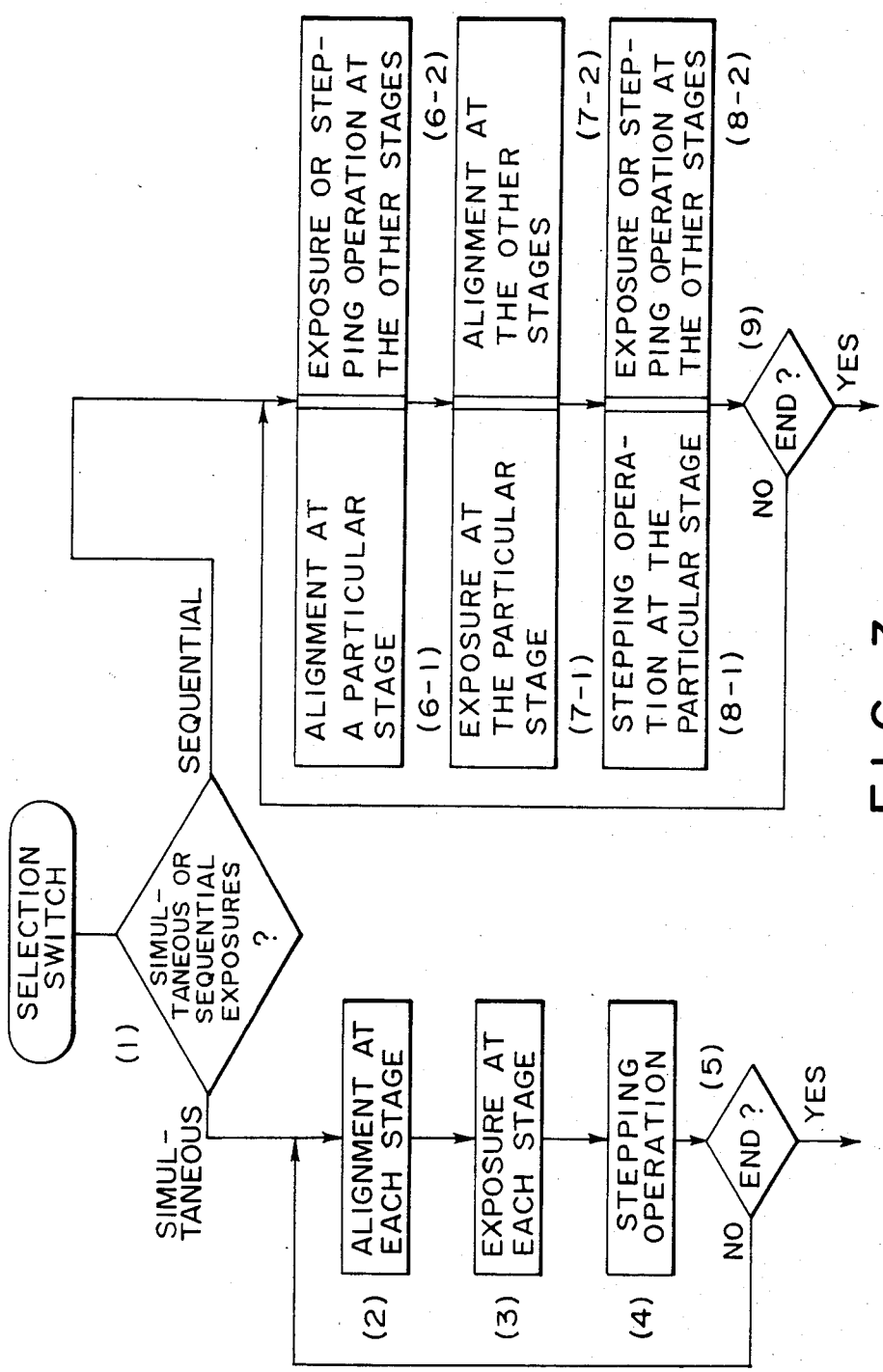
FIG. 3 is a flow chart showing the operation of the exposure apparatus of FIG. 2.

An exposure apparatus according to another embodiment of the present invention will now be described with reference to FIGS. 2 and 3. In this embodiment, the invention is applied to a step-and-repeat type die-by-die exposure apparatus. The exposure apparatus includes a light source such as an excimer laser 11 providing a pulsed Deep-UV beam. The laser 11 is disposed in a horizontal reference plane. The laser beam emitted from the laser 11 and travelling horizontally is deflected upwardly by a mirror 12 and the deflected laser beam is then reflected horizontally by another mirror 13. Designated by a reference numeral 14 is an expander disposed in the path of the horizontally advancing laser beam. If it is desired to change the cross-sectional shape of the laser beam, the expander 14 may comprise an anamorphic afocal converter. Designated by reference numerals 15-17 are swingable mirrors which correspond to the swingable mirrors 2-4 of FIG. 1 embodiment. The expanded parallel laser beam is directed sequentially by these mirrors 15-17 to three exposure units (stepper units) 18-20, respectively. Each of the exposure units 18-20 includes an illumination system comprising an optical integrator 24, 25 or 26 for uniformly illuminating a reticle 21, 22 or 23 and a collimator lens 27, 28 or 29; a reduction projection lens system 30, 31 or 32; a wafer chuck (not shown) for carrying thereon a wafer 33, 34 or 35; and an X-Y stage 50, 51 or 52 for stepwisely moving the wafer chuck along a surface plate 36, 37 or 38 in the directions of X-axis and Y-axis. Each of the surface plate 36-38 is disposed on or in parallel to the horizontal reference plane.

Each of the exposure units 18-20 further includes an alignment detecting unit comprising a pair of alignment detecting optical systems 39-39, 40-40 or 41-41 (only one of the alignment detecting systems of each pair being shown for the sake of simplicity of illustration). In a case of die-by-die alignment, the positional relation between the alignment marks of the reticle and wafer is detected at every shot of exposure, and the alignment is achieved by moving the wafer relative to the reticle in the X, Y and $\theta$ directions by means of an unshown adjusting mechanism. In a case of global alignment, on the other hand, the positional relation between the reticle and wafer is once detected prior to the start of the first stepwise movement of the X-Y stage and then the alignment is achieved. When the alignment is completed, a completion signal is produced by an associated one of the alignment detecting units and the completion signal is supplied to a corresponding one of central processing units 45-47 which are adapted to control the exposure units 18-20, respectively. Designated by reference numerals 42-44 are detectors each for detecting the quantity of light to determine the exposure time. The detectors 42-44 provide output signals which are supplied to the central processing units 45-47, respectively. On the basis of the signals from the detectors 42-44 and of the alignment completion signals supplied from the alignment detecting units, the central processing units 45-47 control the stages 50-52, the alignment detecting units 39-41, a central processing unit 60 conrolling the swingable mirrors 15-17, and a light quantity controlling central processing unit 63 which controls an aperture 61 and an ND filter 62, etc.

The operation of the exposure apparatus according to the present embodiment will now be described. First, the quantity of laser beam is measured by an unshown light quantity measuring device and, on the basis of the results of measurement, an appropriate dimension of the light transmitting section of the aperture 61 and an appropriate ND filter such as at 62 is selected, whereby a desired quantity of laser beam is obtained. It is assumed now that the mirror 15 is in its broken line position, that the first shot area on the wafer 33 is located just below the lens system 30, and that the alignment between the reticle 21 and wafer 33 has already been achieved. That is, the first shot area on the wafer 33 is now being exposed. When the quantity of light as integrated by the detector 42 reaches a predetermined value, the central processing unit 45 supplies an instruction signal to the central processing unit 60 to cause the mirror 15 to return to its solid line position and to cause the mirror 16 to move to its broken line position. By the movement of the mirror 15 to its solid line position, the exposure of the first shot position of the wafer 33 at the first exposure unit 18 is completed. During this exposure step at the first exposure unit 18, the reticle 22 and the first shot area on the wafer 34 at the second exposure unit 19 is aligned with each other. Therefore, the alignment is normally completed before the start of swinging movement of the mirror 16 to its broken line position. However, there is a possibility that the alignment at the second exposure unit 19 is not completed at the time at which the exposure step at the first exposure unit 18 is completed. In view of this, the system may be modified such that the mirror 16 is not actuated until the central processing unit 60 receives both the alignment completion signal from the alignment detecting unit 40 and the exposure completion signal from the first exposure unit 18. When the mirror 16 is moved to its broken line position, the detector 43 starts integration of the quantity of light. The succeeding operations are substantially the same as those in the first exposure unit 18.

During the exposure step at the second exposure unit 19, the X-Y stage 50 of the first exposure unit 18 effects the stepwise movement so that the second shot area of the wafer 33 is located just below the lens system 30. On the other hand, during the exposure step at the second exposure unit 19, an alignment step is executed at the third exposure unit 20.

In this manner, a predetermined number of shots of exposures are performed relative to each of the wafers 33-35 and, subsequently, these wafers are discharged from the stages 50-52.

While in the present embodiment the first to third exposure units are operated periodically, the apparatus may be arranged so that, during the exposure of the first shot area at the first exposure unit 18, the second exposure unit 19 effects alignment of the middle shot area while the third exposure unit 20 effects stepwise movement of the stage 52 for the sake of exposure of the last shot area. In such case, one of the exposure units may perform wafer feeding step or wafer discharging step during the time period during which the other exposure units effect the exposure and/or alignment.

Although in the present embodiment, the mirrors 15-17 are interchanged at every die exposure (an exposure of one shot area), the apparatus may be arranged so that the exposure step at the succeeding exposure unit is initiated after completion of the exposure of all the dies (shot areas) of the wafer at the preceding exposure unit. In such case, the mirrors 15-17 may be actuated in response the exposure completion signals supplied from the central processing units 45-47, respectively. In a case of global alignment, the apparatus is arranged so that, during the time period during which the exposure step is effected at one of the exposure units, the stepwise movement and/or wafer feeding or discharging are effected at the other exposure units.

The exposure apparatus according to the present embodiment is also operable in a simultaneous exposure mode. In this mode, the wafers 33-35 are exposed simultaneously, as compared with the abovedescribed sequential exposure mode. When the simultaneous exposure mode is selected by an operator, the swingable mirrors 15 and 16 are retracted by an unshown mechanism and two half mirrors are moved to the positions of the mirrors 15 and 16, respectively, by the unshown mechanism. The remaining swingable mirror 17 is moved to the position shown in FIG. 2. By this, all the wafers 33-35 can be exposed at the same time.

While the invention has been described with reference to the structures disclosed herein, it is not confined to the details set forth and this disclosure is intended to cover such modifications or changes as may come within the purposes of the improvements or the scope of the following claims.

What is claimed is:

1. An exposure apparatus for transferring mask patterns onto respective wafers, comprising:
    a light source;
    a first exposure unit including a member for supporting a first mask, a projection optical system for projecting the image of the first mask onto a first wafer, and a stage for stepwisely moving the first wafer;
    a second exposure unit having a member for supporting a second mask, a projection optical system for projecting the image of the second mask onto a second wafer, and a stage for stepwisely moving the second wafer;
    control means for effecting an operation of said second exposure unit preparatory to the exposure operation during a time period during which the first wafer at said first exposure unit is exposed; and
    light distributing means for sequentially distributing the light from said light source to the masks supported by said mask supporting members of said first and second exposure units.

2. An apparatus for selectively exposing workpieces to a patterned light beam, comprising:
    a light for producing a light beam on a light path;
    a plurality of stages for carrying the workpieces, respectively;
    means for exposing the workpieces carried on said stages to a patterned light beam, said exposing means including optical deflecting means for selectively directing substantially all the light received along the path of the light beam from said light source to one of said stages, said exposing means further including pattern forming means for forming a patterned light beam from the light beam produced by said light source, said pattern forming means located in the path of the light beam between said light source and the selected one of said stages, such that the workpiece which is carried on the selected one of said stages is exposed to a patterned light beam.

3. An apparatus according to claim 2, wherein said optical deflecting means directs substantially all the light beam from said light source to said stages in sequence.

4. An apparatus according to claim 2, wherein said light source an excimer laser.

5. An apparatus for exposing workpieces to a patterned light beam, comprising:
    a light source for producing a light beam;
    a plurality of stages for carrying the workpieces respectively; and
    means for exposing the workpieces carried on said stages to a patterned light beam, said exposing means including qptical deflecting means for directing the light beam from said light source to said stages and pattern forming means for forming a patterned light beam from the light beam produced by said light source, so as to expose said stages to a patterned light beam;
    wherein each of said stages is movable independently of the other so that the position of each of the workpieces carried on the stages is independently adjustable.

6. An apparatus according to claim 5, wherein said optical deflecting means directs the light beam from said light source to said stages in sequence.

7. An apparatus according to claim 5 wherein said qptical deflecting means directs portions of the light beam from said light source to said stages, respectively.

8. An apparatus according to claim 5, wherein said light source comprises an excimer laser.

9. An exposure apparatus for transferring mask patterns onto respective workpieces, comprising:
    a light source for producing a light beam;
    a first exposure unit, including a member for supporting a first mask, and a member for supporting a first workpiece, for exposing the first workpiece to a mask pattern;
    a second exposure unit, including a member for supporting a second mask, and a member for supporting a second workpiece, for exposing the second workpiece to a mask pattern;
    control means for effecting an operation of said second exposure unit preparatory to the exposure operation during a time period during which the first workpiece at said exposure unit is exposed; and
    light distributing means for sequentially distributing the light from said light source to the masks supported by said mask supporting members of said first and second exposure units.

10. An apparatus according to claim 9, wherein said light source comprises an excimer laser.

11. An apparatus according to claim 9, wherein said light source is disposed in a horizontal reference plane.

* * * * *

UNITED STATES PATENT AND TRADEMARK OFFICE
CERTIFICATE OF CORRECTION

PATENT NO. : 4,653,903  
DATED : March 31, 1987  
INVENTOR(S) : MAKOTO TORIGOE, ET AL.

Page 1 of 2

It is certified that error appears in the above-identified patent and that said Letters Patent is hereby corrected as shown below:

COLUMN 1

Line 11,   "large scaled" should read --large-scale--.  
    Line 26,   "wafer." should read --the wafer.--.  
    Line 26,   "each the current" should read --each current--.  
    Line 38,   "manufacuring" should read --manufacturing--.

COLUMN 2

Line 30,   "of wafers." should read --of the wafers.--.

COLUMN 3

Line 46,   "plate" should read --plates--.

COLUMN 4

Line 36,   "is" should read --are--.

COLUMN 5

Line 12,   "response the" should read --reponse to the--.  
    Line 22,   "abovedescribed" should read --above-described--.

UNITED STATES PATENT AND TRADEMARK OFFICE
CERTIFICATE OF CORRECTION

PATENT NO. : 4,653,903            Page 2 of 2

DATED : March 31, 1987

INVENTOR(S) : MAKOTO TORIGOE, ET AL.

It is certified that error appears in the above-identified patent and that said Letters Patent is hereby corrected as shown below:

COLUMN 6

Line 16,    "source an" should read --source comprises an--.
     Line 24,    "qptical" should read --optical--.
     Line 32,    "the stages" should read --said stages--.
     Line 37,    "5 wherein" should read --5, wherein--.
     Line 38,    "qptical" should read --optical--.

Signed and Sealed this

Fifteenth Day of September, 1987

Attest:

DONALD J. QUIGG

Attesting Officer        Commissioner of Patents and Trademarks